United States Patent
Lee et al.

(10) Patent No.: US 7,700,450 B2
(45) Date of Patent: *Apr. 20, 2010

(54) METHOD FOR FORMING MOS TRANSISTOR

(75) Inventors: Kun-Hsien Lee, Tai-Nan (TW);
Cheng-Tung Huang, Kao-Hsiung (TW);
Shyh-Fann Ting, Tai-Nan (TW);
Wen-Han Hung, Kao-Hsiung (TW);
Li-Shian Jeng, Tai-Tung Hsien (TW);
Tzyy-Ming Cheng, Hsin-Chu (TW)

(73) Assignee: United Microelectronics Corp., Hsin-Chu (TW)

( * ) Notice: Subject to any disclaimer, the term of this patent is extended or adjusted under 35 U.S.C. 154(b) by 570 days.

This patent is subject to a terminal disclaimer.

(21) Appl. No.: 11/552,957

(22) Filed: Oct. 25, 2006

(65) Prior Publication Data

US 2008/0102588 A1    May 1, 2008

(51) Int. Cl.
    *H01L 21/336* (2006.01)
(52) U.S. Cl. ............... 438/301; 438/232; 438/302; 438/519; 438/522; 438/527; 438/530
(58) Field of Classification Search ............ None
    See application file for complete search history.

(56) References Cited

U.S. PATENT DOCUMENTS

| 5,885,861 | A | 3/1999 | Shoyab et al. |
| 5,893,742 | A | 4/1999 | Demirlioglu |
| 6,037,640 | A * | 3/2000 | Lee .................. 257/408 |
| 6,682,980 | B2 | 1/2004 | Chidambaram et al. |
| 7,109,099 | B2 * | 9/2006 | Tan et al. ............ 438/527 |
| 7,135,365 | B2 | 11/2006 | Liu et al. |
| 7,396,717 | B2 * | 7/2008 | Wang et al. .......... 438/232 |

FOREIGN PATENT DOCUMENTS

| TW | 586182 | 5/2004 |
| TW | I248167 | 1/2006 |

* cited by examiner

*Primary Examiner*—Zandra Smith
*Assistant Examiner*—Khanh B Duong
(74) *Attorney, Agent, or Firm*—Winston Hsu

(57) ABSTRACT

A method for forming a MOS transistor includes providing a substrate having at least a gate structure formed thereon, performing a pre-amorphization (PAI) process to form amorphized regions in the substrate, sequentially performing a co-implantation process, a first ion implantation process, and a first rapid thermal annealing (RTA) process to form lightly doped drains (LDDs), forming spacers on sidewalls of the gate structure, and forming a source/drain.

45 Claims, 16 Drawing Sheets

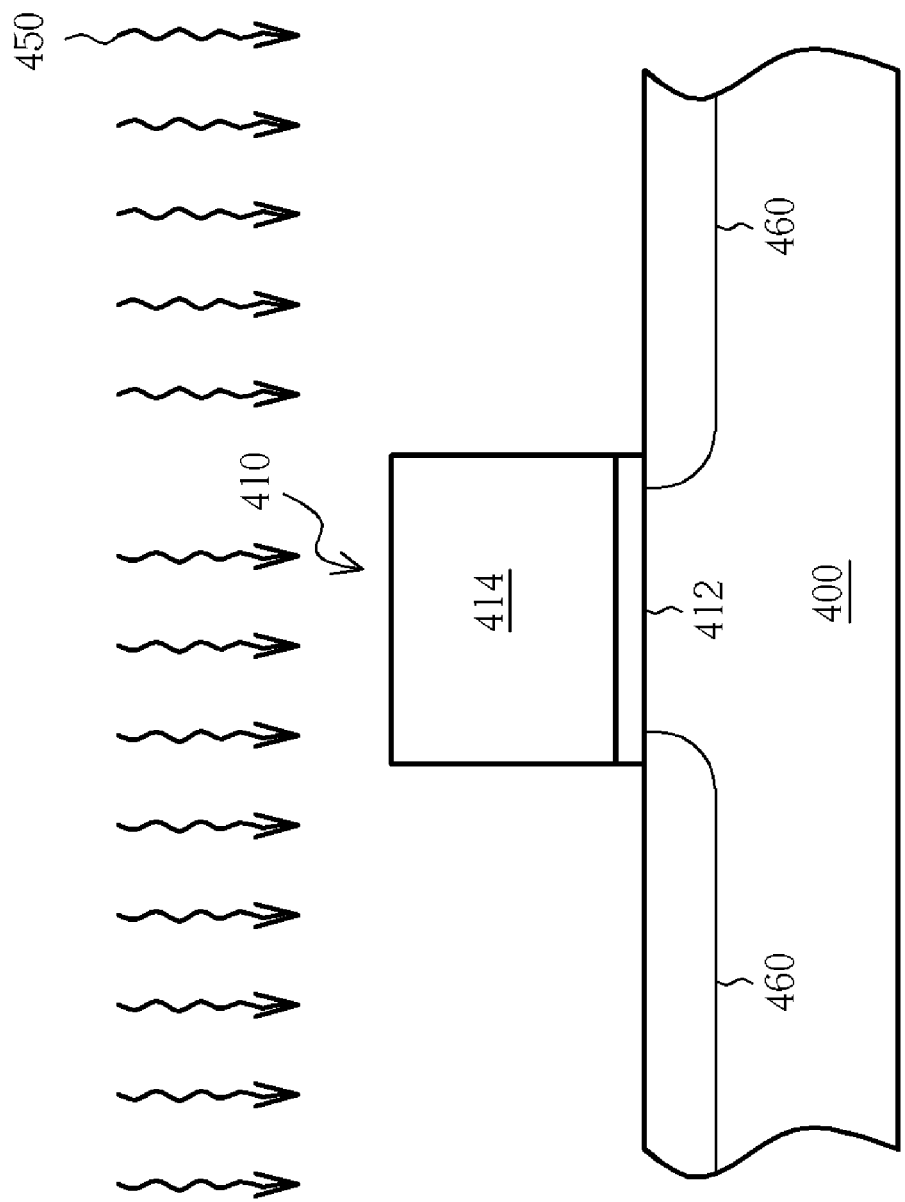

METHOD FOR FORMING MOS TRANSISTOR

BACKGROUND OF THE INVENTION

1. Field of the Invention

The present invention relates to a method for forming metal-oxide semiconductor (MOS) transistor, and more particularly, to a method for forming MOS transistor capable of effectively improving a transient enhanced diffusion (TED) effect and a short channel effect.

2. Description of the Prior Art

With progress in the semiconductor industry, performance and economic factors of integrated circuit design and manufacture have caused a scale of devices in integrated circuits to be drastically reduced to miniaturized sizes, increasing density on a chip. However, a short channel effect, which results in a poor threshold voltage roll-off characteristic, always accompanies miniaturization. To avoid this problem, the prior art has provided a method for forming lightly doped drains (LDDs) having an ultra shallow junction as a solution.

In a conventional ultra shallow junction formation, a low energy ion implantation process is performed in a shallow surface of a substrate adjacent to two sides of a gate structure, then a rapid thermal annealing (RTA) process is performed to form a junction profile. However, as device scale is reduced to 90-nm and smaller, the conventional ultra shallow junction formation hits a limitation in depth control, and co-implantation performed in cooperation with pre-amorphization (PAI) and laser annealing seems to be able to satisfy demands down to 65-nm and even 45-nm processes.

During the ion implantation process, considerable interstitial defects are created because the implanting ion causes damage to a silicon lattice. The interstitial defects become diffusion paths for a dopant, such as a relatively highly diffusive boron. The diffusion paths greatly enhance the diffusion of the dopant, causing a so-called transient enhanced diffusion (TED) effect, in a following annealing process. TED effect not only deepens the junction profile, but also makes the distribution of the dopant not sheer in a lateral direction, resulting in a severe short channel effect. The idea behind co-implantation is to co-implant ions, such as carbon, to combine with the interstitial defects. Therefore TED effect is reduced and boron clusters are prevented from forming.

Please refer to FIGS. 1-3, which are schematic drawings of a conventional method for forming LDDs having an ultra shallow junction that adopts a co-implantation process. As shown in FIG. 1, a substrate 100 having a gate dielectric layer 102 and a gate 104 formed thereon is provided. A pre-amorphization (PAI) process 110 is performed with antimony (Sb) or germanium (Ge) to damage a silicon lattice of the substrate 100, forming amorphized regions 112. The damaged silicon lattice in the amorphized regions 100 is used to reduce a TED effect and a channeling effect.

Please refer to FIG. 2. A co-implantation process 120 is performed to implant carbon or fluorine vertically into the substrate 100, then a p-dopant implantation process 130 and a first RTA process 140 are sequentially performed to form PLDDs 150 having an ultra shallow junction. Please refer to FIG. 3. Offset spacers 160 are formed on the sidewalls of the gate 104, then another p-dopant implantation 170 and a second RTA process 180 are performed to form a source/drain 190 in the substrate 100 adjacent to the offset spacers 160.

However, because the co-implant dopant is vertically implanted into the substrate 100, its control over lateral diffusion of the p-dopant is not fully satisfactory. Therefore a method that can effectively reduce the abovementioned TED effect and lateral diffusion, thus preventing the junction profile of the ultra shallow junction of the LDD from being influenced by the diffusion and from changing, is still needed.

SUMMARY OF THE INVENTION

Therefore the present invention provides a method for forming a MOS transistor capable of reducing a TED effect and a short channel effect.

According to the claimed invention, a method for forming a MOS transistor is provided. The method comprises providing a substrate having at least a gate structure formed thereon, performing a pre-amorphization (PAI) process to form amorphized regions in the substrate adjacent to two sides of the gate structure, performing a co-implantation process to implant a co-implant dopant into the amorphized regions, performing a first ion implantation process to implant a first dopant into the amorphized regions, performing a first rapid thermal annealing (RTA) process to activate the first dopant and the co-implant dopant, regrow the amorphized regions to a substantially crystalline form, and form lightly doped drains (LDDs) in the amorphized regions, forming spacers on sidewalls of the gate structure, and forming a source/drain in the substrate adjacent to the spacers.

According to the claimed invention, another method for forming a MOS transistor is provided. The method comprises providing a substrate having at least a gate structure formed thereon, performing a co-implantation process to implant a co-implant dopant into the substrate adjacent to two sides of the gate structure, performing a pre-amorphization (PAI) process to form amorphized regions in the substrate adjacent to the two sides of the gate structure, performing a first ion implantation process to implant a first dopant into the amorphized regions, performing a first rapid thermal annealing (RTA) process to activate the co-implant dopant and the first dopant, regrow the amorphized regions to a substantially crystalline form, and form lightly doped drains (LDDs) in the amorphized regions, and forming source/drains in the substrate.

According to the claimed invention, still another method for forming a MOS transistor is provided. The method comprises providing a substrate having at least a gate structure formed thereon, performing a pre-amorphization (PAI) process to form amorphized regions in the substrate adjacent to the gate structure, performing a first ion implantation process to implant a first dopant into the amorphized regions, performing a co-implantation process to implant a co-implant dopant into the amorphized regions, performing a first rapid thermal annealing (RTA) process to activate the first dopant and the co-implant dopant, regrow the amorphized regions to a substantially crystalline form, and form lightly doped drains (LDD) in the amorphized regions, and forming source/drains in the substrate.

Because the co-implantation process is performed before the PAI process, before the first ion implantation process, or after the first ion implantation process, the lateral diffusion and TED effect of the first dopant are reduced. The present invention thus provides a method for forming MOS transistor capable of controlling diffusion of the first dopant, providing a good junction profile, and reducing a short channel effect.

These and other objectives of the present invention will no doubt become obvious to those of ordinary skill in the art after

BRIEF DESCRIPTION OF THE DRAWINGS

FIGS. 13-16 are schematic drawings illustrating a third preferred embodiment provided by the present invention.

DETAILED DESCRIPTION

Figure 1:
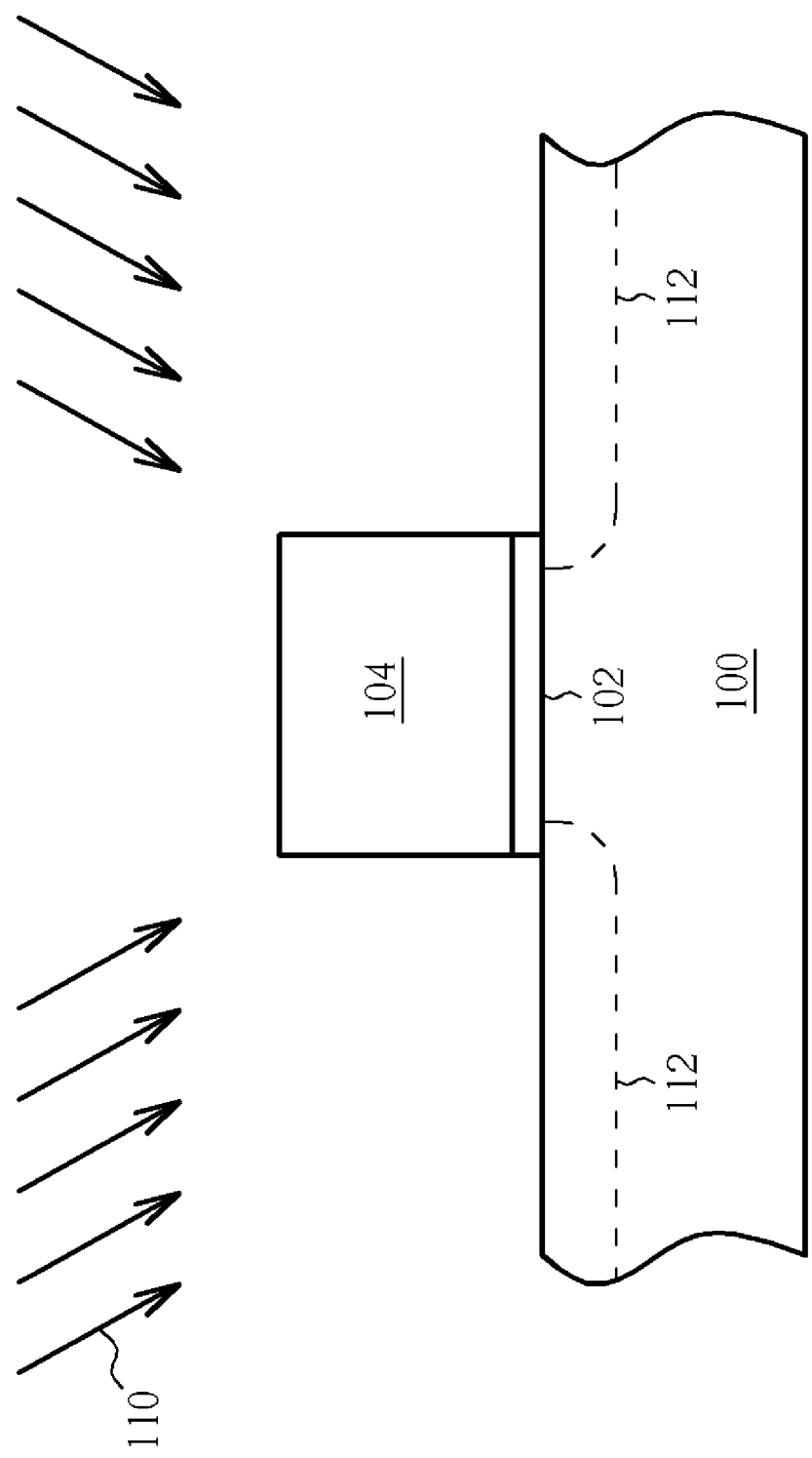
FIGS. 1-3 are schematic drawings of a conventional method for forming LDDs having an ultra shallow junction by adopting a co-implantation process.
Figure 2:
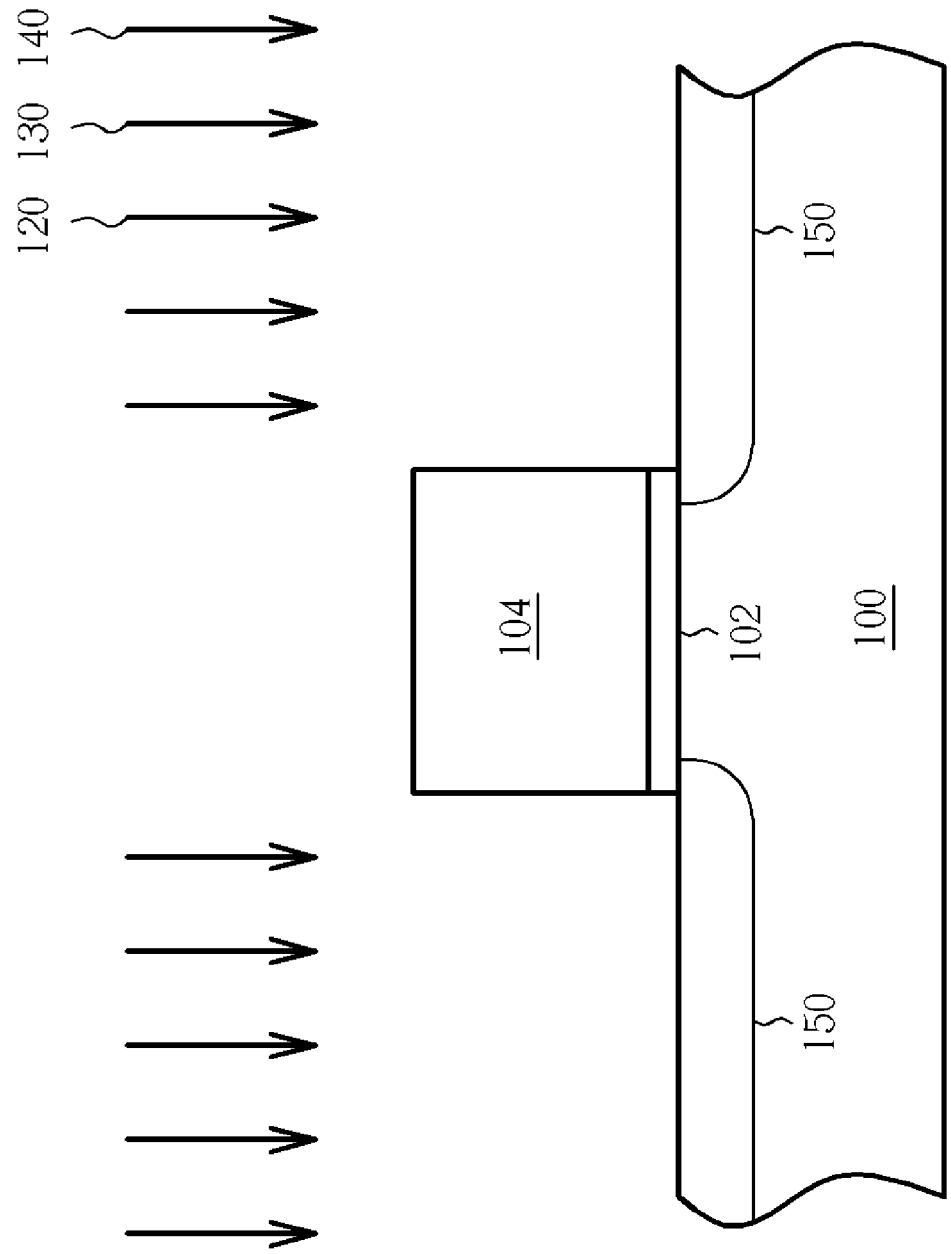
Figure 3:
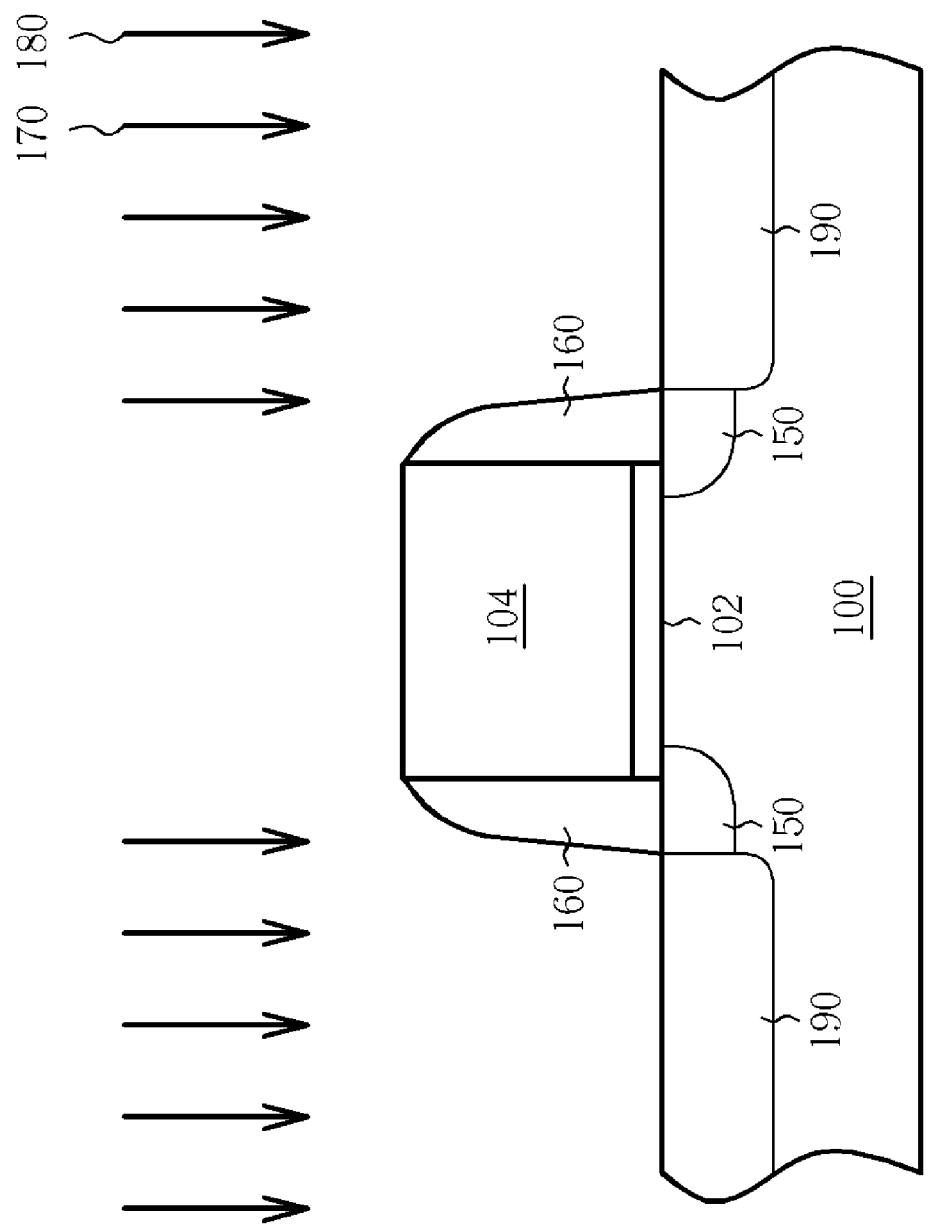
Figure 4:
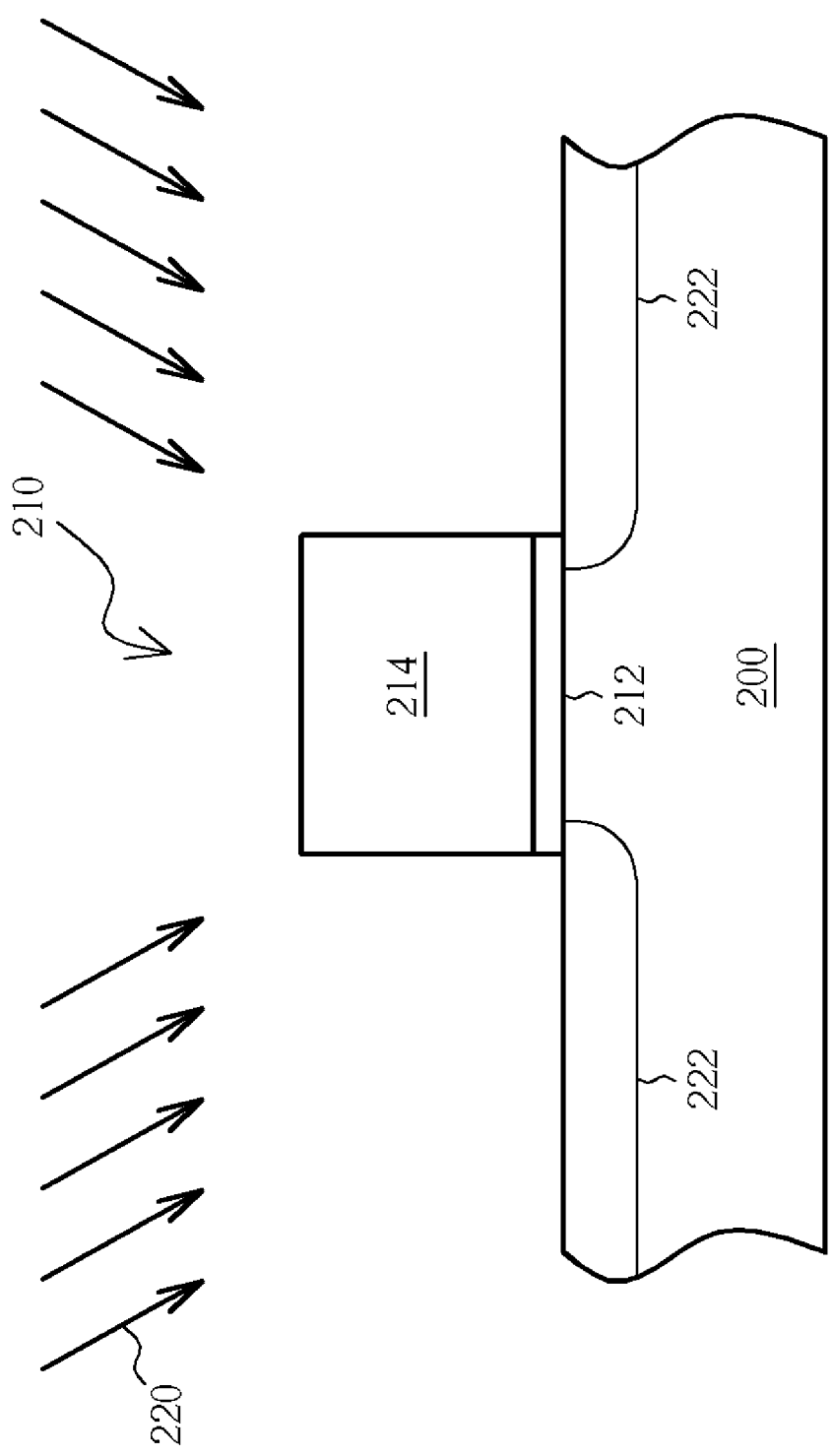
FIGS. 4-8 are schematic drawings illustrating a first preferred embodiment provided by the present invention.

Please refer to FIGS. 4-8, which are schematic drawings illustrating a first preferred embodiment provided by the present invention. As shown in FIG. 4, a substrate 200 is provided. The substrate 200 comprises a semiconductor wafer, or a silicon-on-insulator (SOI) wafer, etc. The substrate 200 has completely undergone a shallow trench isolation (STI) process and a well formation process, and at least a gate structure 210 having a gate dielectric layer 212 and a gate 214 is formed on the substrate 200. Then a vertical or angled pre-amorphization (PAI) process 220 is performed to form amorphized regions 222 in the substrate 200 adjacent to two sides of the gate structure 210.

Figure 5:
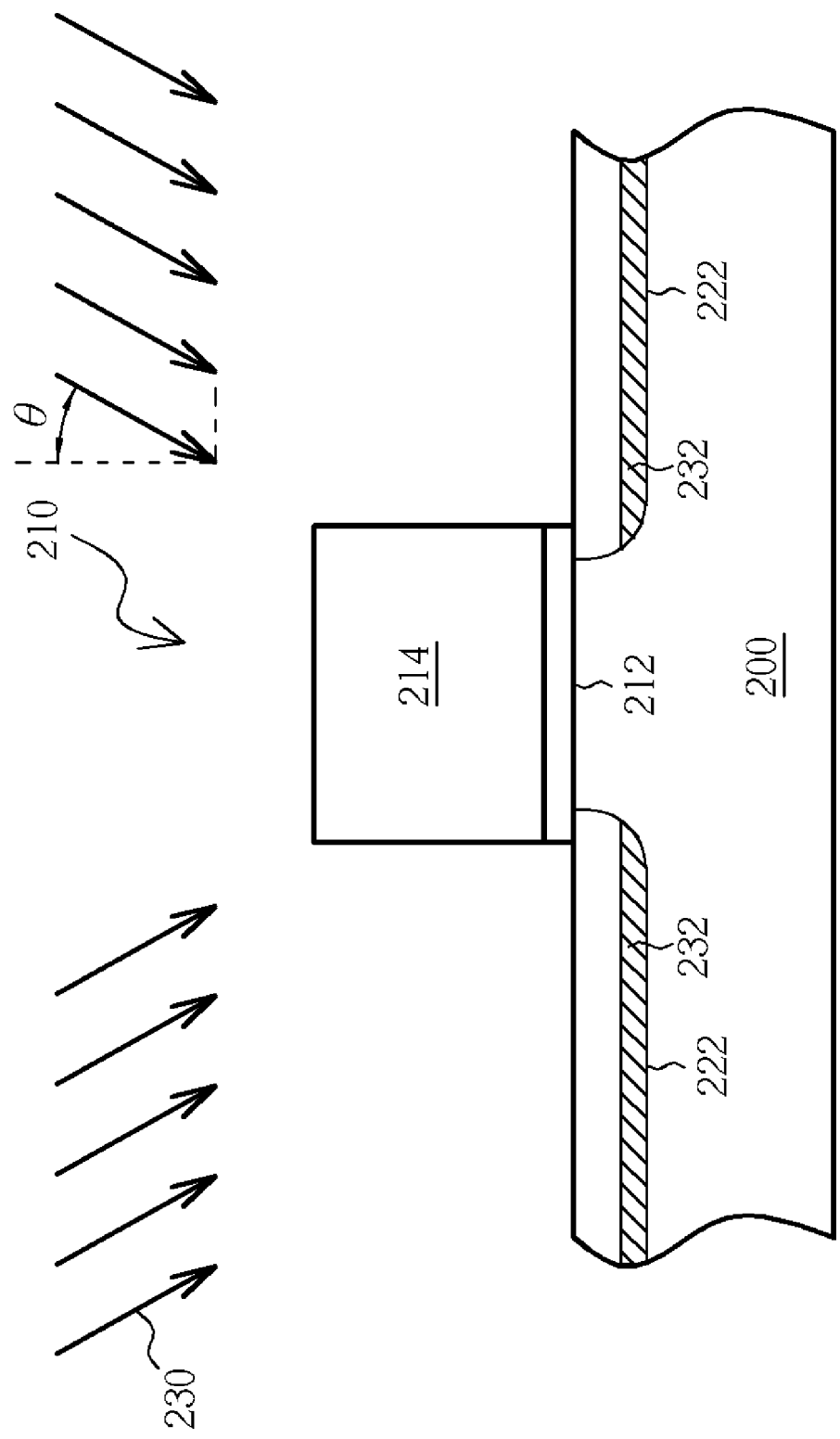

Please refer to FIG. 5. A co-implantation process 230 is subsequently performed to implant a co-implant dopant 232 into the amorphized regions 222. It is noteworthy that the co-implantation process 230 is an oblique angle implantation process and that an angle θ used in the process is in a range from 0-45 degrees. The co-implant dopant 232 comprises carbon, fluorine, or nitrogen. A co-implantation energy depends on an implant position in the substrate 200, such as 3 KeV to 20 KeV; a dose may be $1\times10^{15}$ to $5\times10^{15}$ atoms/cm$^3$.

Figure 6:
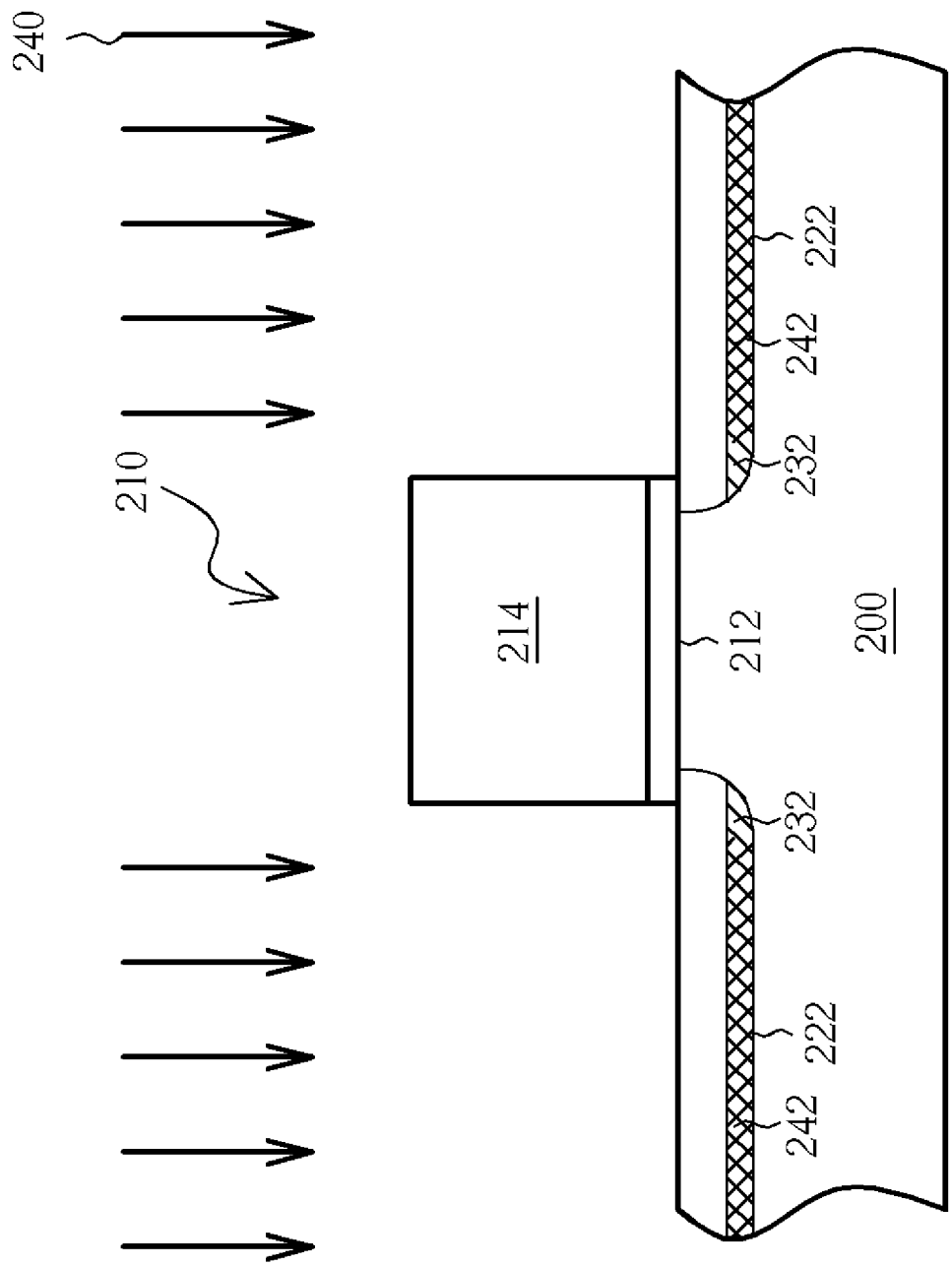
Figure 7:
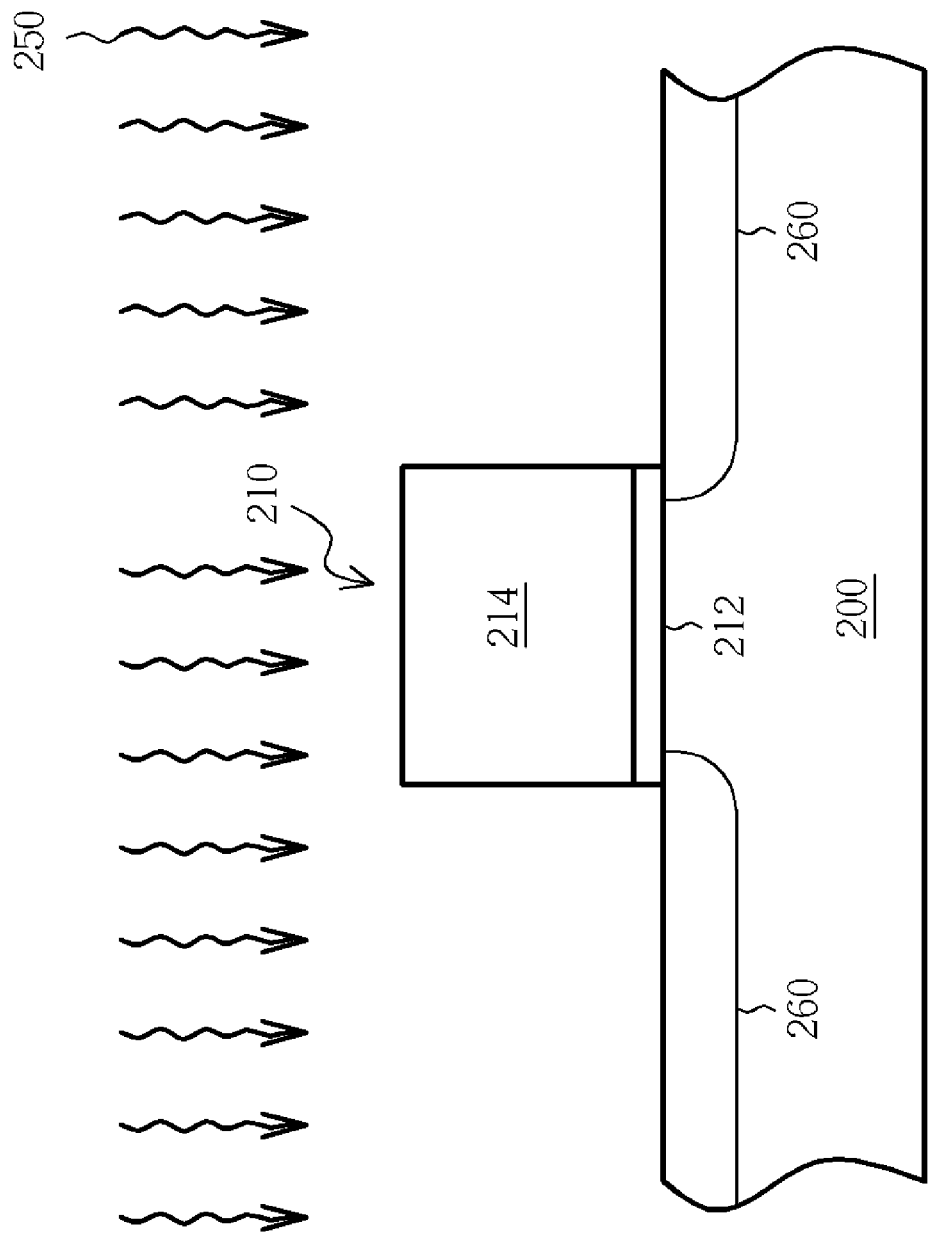

Please refer to FIG. 6. Then, a first ion implantation process 240 is performed to implant a first dopant 242 into the amorphized regions 222. The first dopant 242 is implanted into the substrate 200 at a position substantially the same as that of the co-implant dopant 232. When the MOS transistor is a P-type MOS, the first dopant 242 comprises Group Three elements, such as boron (B) or gallium (Ga), that act as acceptors for extra holes. When the MOS transistor is an N-type MOS, the first dopant 242 comprises Group Five elements, such as phosphorous (P) or arsenic (As), that act as donors for extra electrons. As shown in FIG. 7, a first rapid thermal annealing (RTA) process 250 is then performed in a furnace or by a rapid thermal process (RTP). The co-implant dopant 232 and the first dopant 242 are activated at a temperature of 1000-1100° C. and the silicon lattice of the amorphized region 222 is regrown to a substantially crystalline form, thus forming lightly doped drains (LDDs) 260 in the amorphized regions 222.

Figure 8:
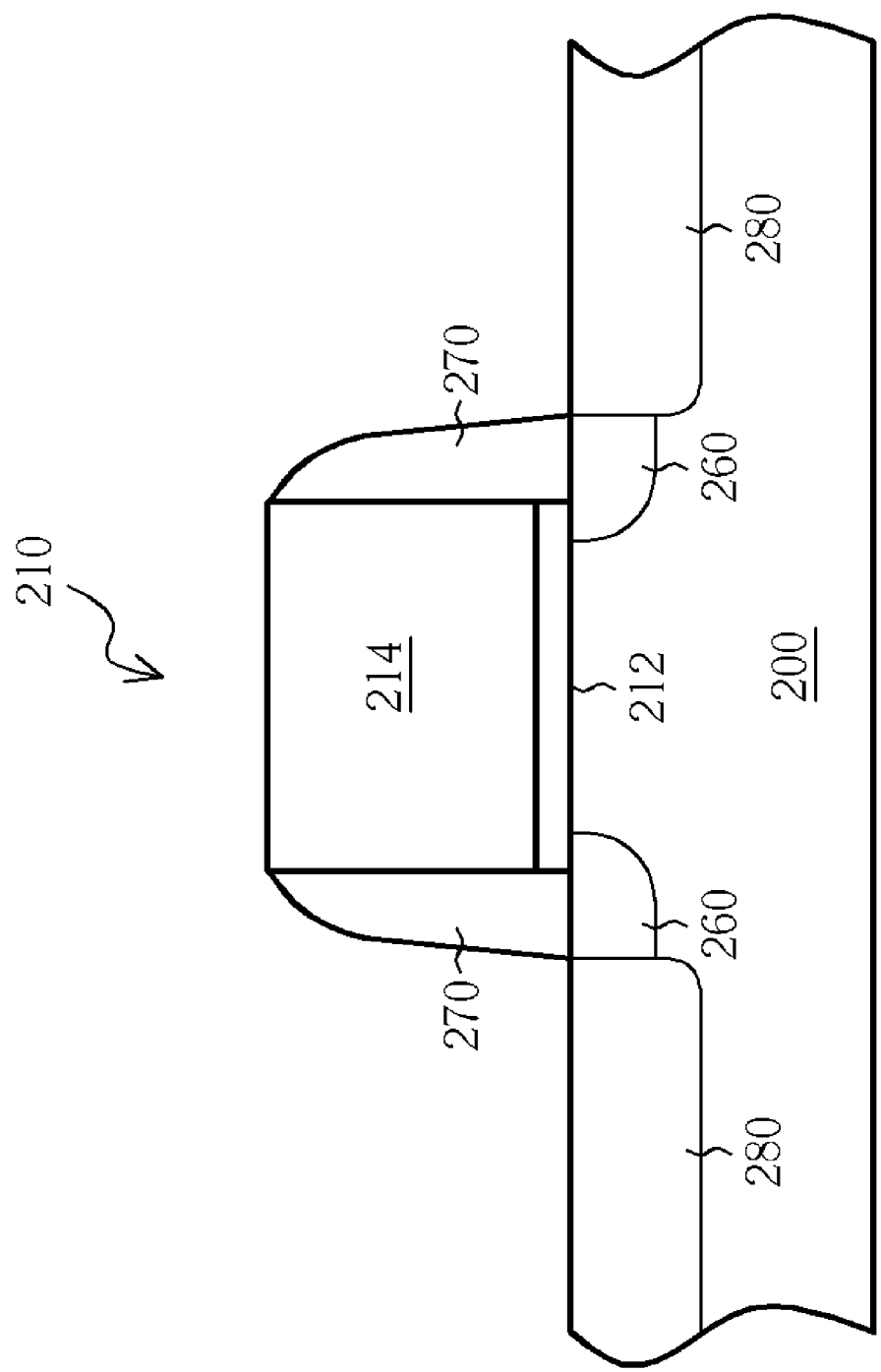

Please refer to FIG. 8. Then spacers 270 such as ONO offset spacers are formed on sidewalls of the gate structure 210. After forming the spacers 270, a second ion implantation process is performed to form source/drain regions in the substrate 200 adjacent to the spacers 270. Following the second ion implantation process, a third RTA process is performed to form a source/drain 280 in the source/drain regions. These processes are well known to those skilled in the art and further detailed description is therefore omitted here for brevity. In addition, the spacers 270 can be removed after forming the source/drain 280 depending on specific process or product requirements.

Please refer to FIG. 5 again. It is noteworthy that in the first preferred embodiment, a second RTA process can be added after performing the co-implantation process 230. By activating the co-implant dopant 232 at a temperature of 1000-1100° C. in a furnace or by an RTP, the co-implant dopant 232 can combine with the interstitial defects in advance to further suppress the TED effect.

Additionally, in the first preferred embodiment, a pocket implantation process can be added before or after the co-implantation process 230 to form pocket-doped regions at an interface between the amorphized regions 222 and the substrate 200 to reduce a punch through effect.

Figure 9:
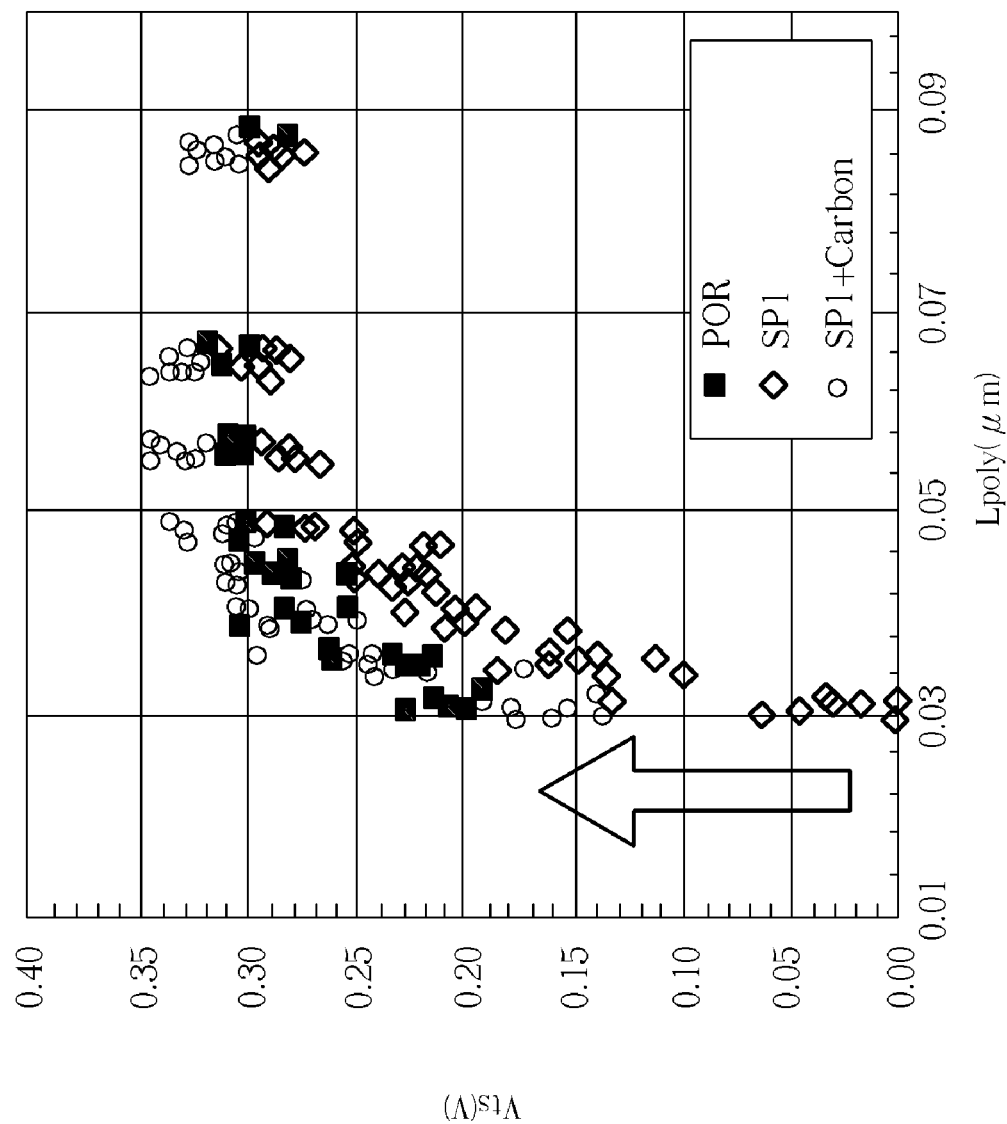
FIG. 9 is a comparison diagram illustrating threshold voltage roll-off.

Please refer to FIG. 9, which is a comparison diagram illustrating threshold voltage roll-off. The transverse axis represents an after-etch-inspect (AEI) critical dimension (CD) of a polysilicon gate, measured in micrometers (μm), and the longitudinal axis represents a threshold voltage (Vts), measured in Volts. Rhombic dots represent measurements of a conventional MOS transistor, round dots represent the measurements of the MOS transistor formed by the first preferred embodiment, and square dots represent standard values. As shown in FIG. 9, as a scale of the polysilicon gate is reduced, control over the short channel effect, which leads to drop-off of the threshold voltage of the MOS transistor, becomes increasingly difficult. When the length of the polysilicon gate of the conventional MOS transistor reaches 0.03 μm, the threshold voltage drops to 0 V, which means the MOS transistor is no longer operable. Also, as shown in FIG. 9, the MOS transistor formed according to the method provided by the first preferred embodiment of the present invention shows an improvement in the threshold voltage from 0.15 V to 0.35 V, which substantially conforms to the desired standard value. Therefore, it is inferred that the method for forming the MOS transistor provided by the present invention effectively suppresses the TED effect and the short channel effect.

Figure 10:
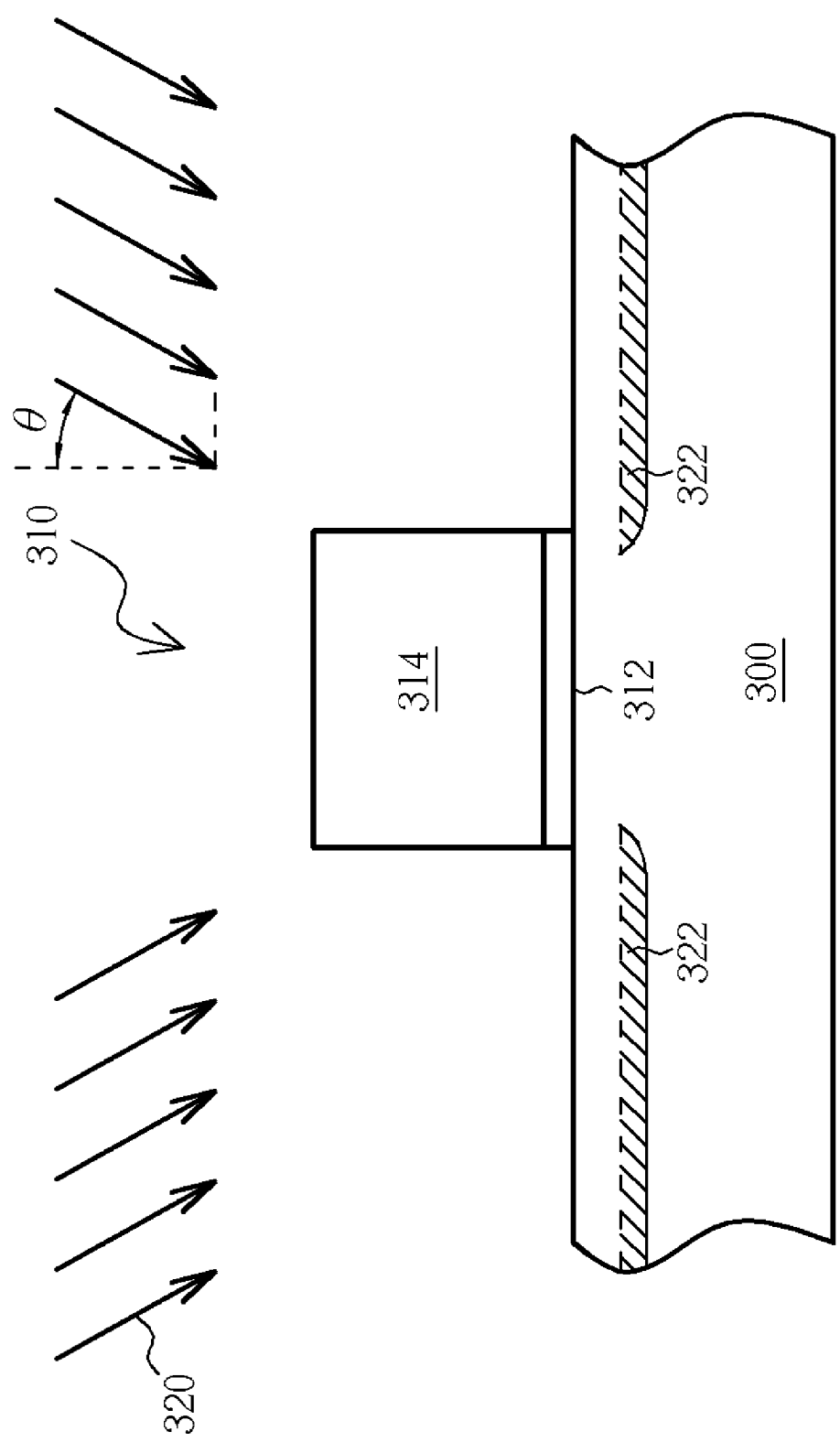
FIGS. 10-12 are schematic drawings illustrating a second preferred embodiment provided by the present invention.
Figure 11:
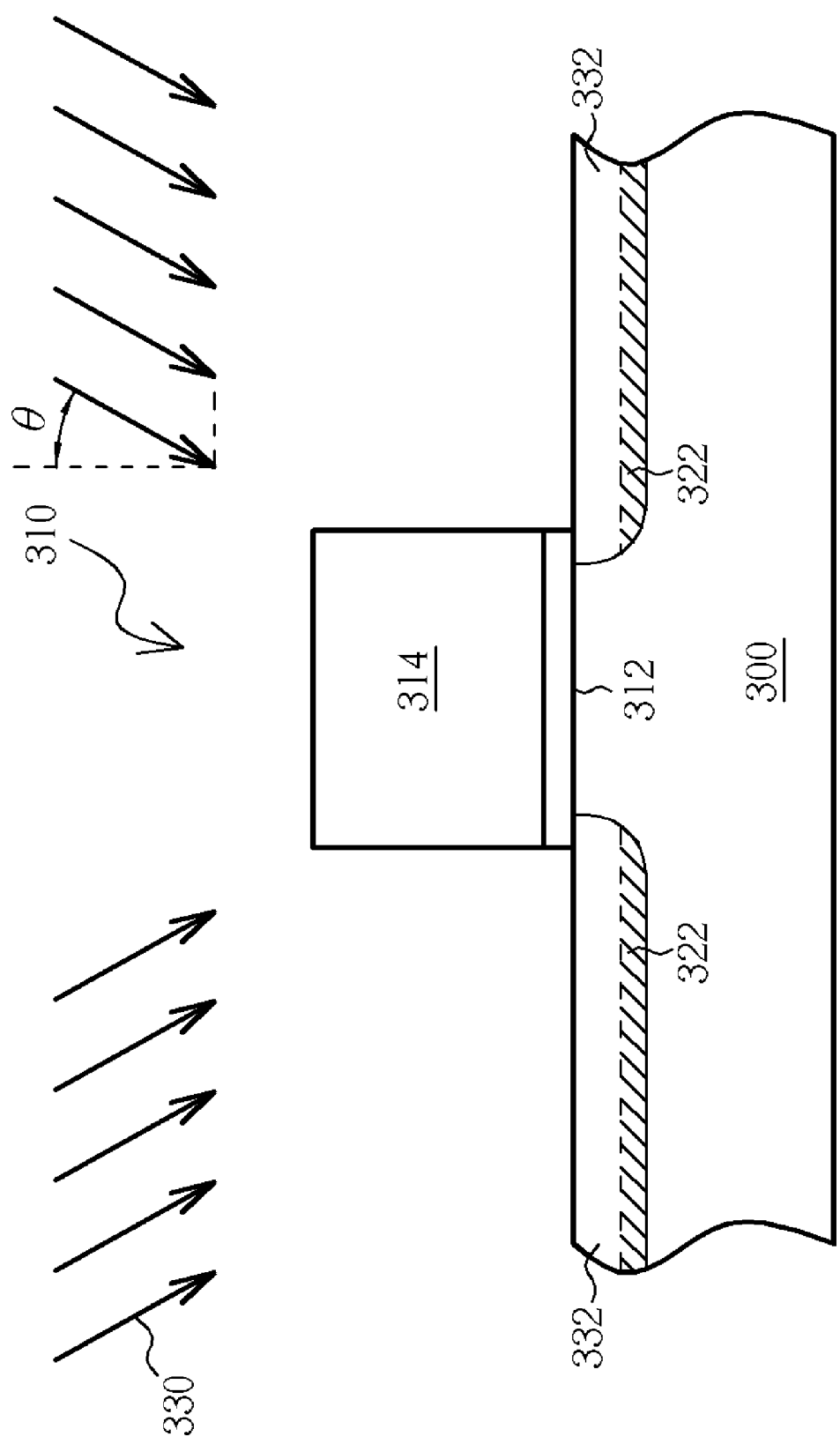
Figure 12:
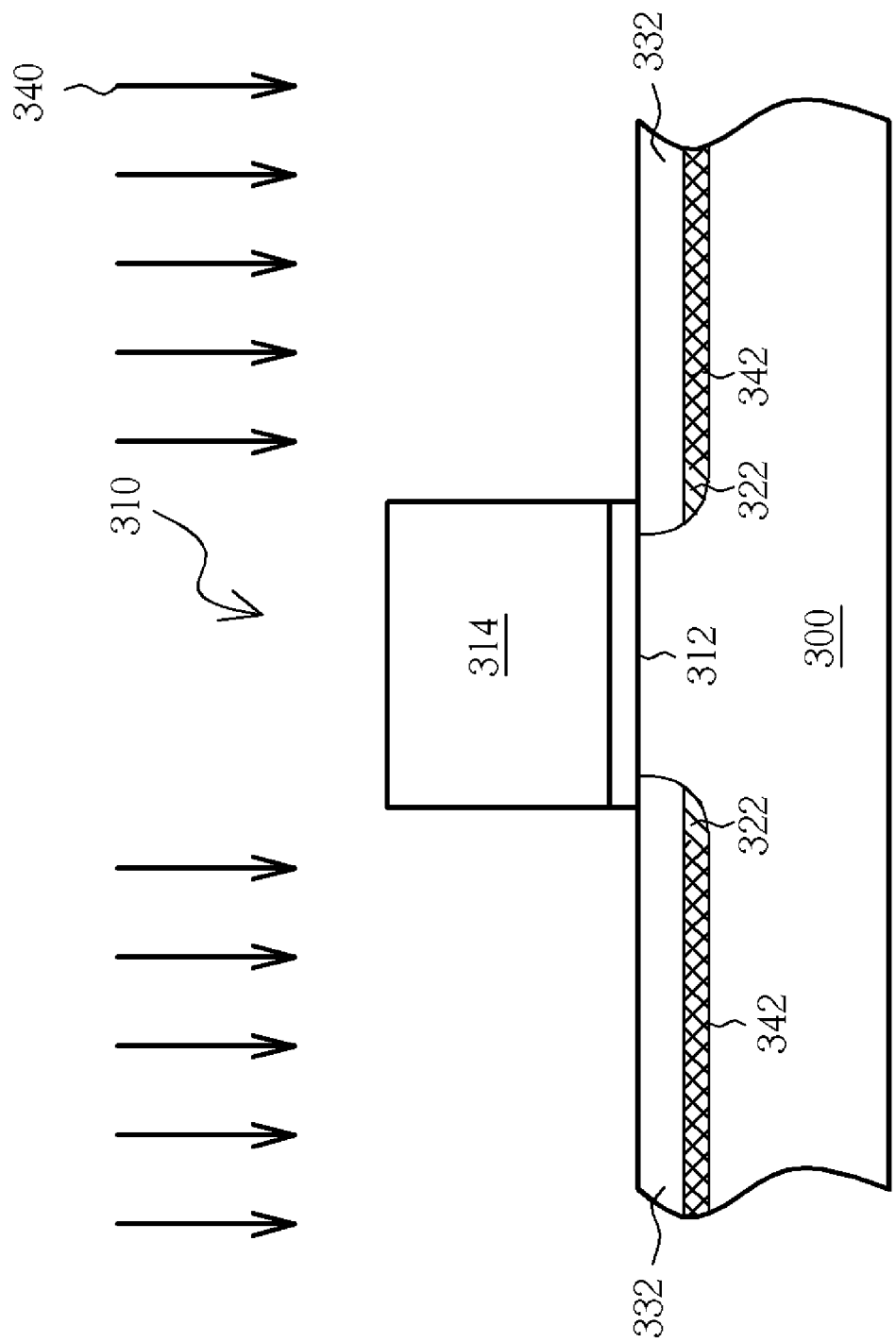

Please refer to FIGS. 10-12, which are schematic drawings illustrating a second preferred embodiment provided by the present invention. As shown in FIG. 10, a substrate 300 having at least a gate structure 310 comprising a gate dielectric layer 312 and a gate 314 formed thereon is provided. Then a co-implantation process 320 is performed to implant a co-implant dopant 322 into the substrate 300 adjacent to two sides of the gate structure 310. It is noteworthy that the co-implantation process 320 is an oblique angle implantation process and an oblique angle θ used in the co-implantation process 320 is in a range from 0-45 degrees. The co-implant dopant 322 comprises carbon, fluorine, or nitrogen. A co-implantation energy depends on an implant position in the substrate 200, such as 3 KeV to 20 KeV; a dose may be $1\times10^{15}$ to $5\times10^{15}$ atoms/cm$^3$.

Please refer to FIGS. 11 and 12. A vertical or angled PAI process 330 is performed to form amorphized regions 332 in the substrate 300 adjacent to the two sides of the gate structure 310. Then, as shown in FIG. 12, a first ion implantation process 340 is performed to implant a first dopant 342 into the substrate 300, wherein the first dopant 342 is implanted into the amorphized regions 332 at a position substantially the same as that of the co-implant dopant 322.

As mentioned above, a first RTA process is performed following the first ion implantation 340. The co-implant dopant 322 and the first dopant 342 are activated at a temperature of 1000-1100° C. in a furnace or by an RTP. Meanwhile a silicon lattice of the amorphized regions 332 is regrown, and thus lightly doped drains (LDDs) are formed. When the MOS transistor is a P-type MOS, the first dopant 242 comprises Group Three elements, such as boron (B) or gallium (Ga), acting as acceptors for extra holes. When the MOS transistor is an N-type MOS, the first dopant 242 comprises Group Five elements, such as phosphorous (P) or arsenic (As), acting as donors for extra electrons Then, spacers are formed on sidewalls of the gate structure 310. A second ion implantation process and a third RTA process are sequentially performed to form a source/drain. The spacers can be removed after forming the source/drain depending on process or product requirements. The processes described are similar to the processes of the first preferred embodiment, therefore further description of these processes is omitted for the second preferred embodiment.

In the second preferred embodiment, a second RTA process can be added after performing the co-implantation process 320 to pre-activate the co-implant dopant 322 at a temperature of 1000-1100° C. in a furnace or by an RTP. The activated co-implant dopant combines with the interstitial defects in advance and thus suppresses the TED effect.

Additionally, in the second preferred embodiment, a pocket implantation process can be added before or after the co-implantation process 320 to form pocket-doped regions at an interface between the amorphized regions 332 and the substrate 300 to reduce a punch through effect.

Figure 13:
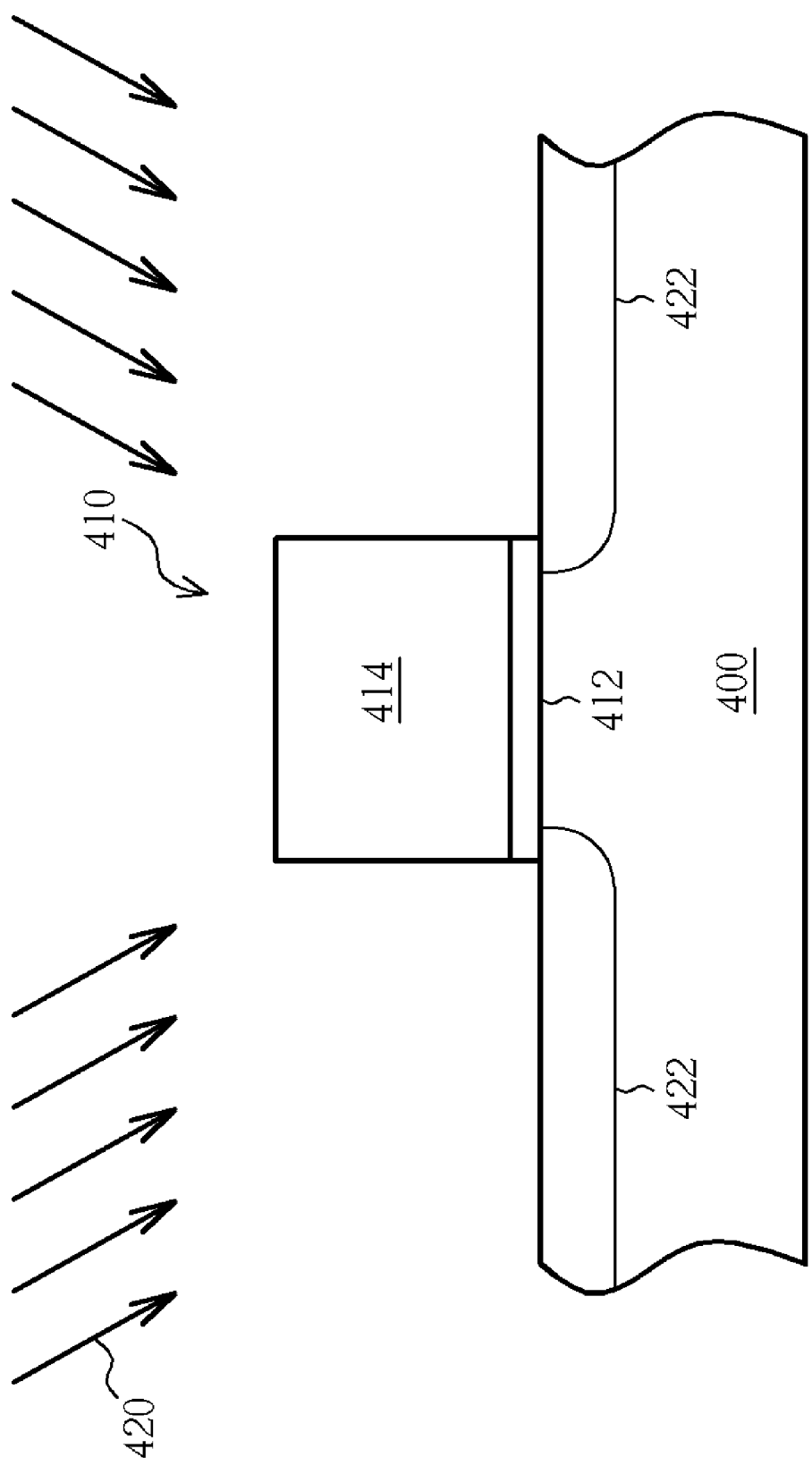

Please refer to FIGS. 13-16, which are schematic drawings illustrating a third preferred embodiment provided by the present invention. As shown in FIG. 13, a substrate 400 having at least a gate structure 410 comprising a gate dielectric layer 412 and a gate 414 formed thereon is provided. Then, a vertical or angled PAI process 420 is performed to form amorphized regions 422 in the substrate 400 adjacent to two sides of the gate structure 210.

Figure 14:
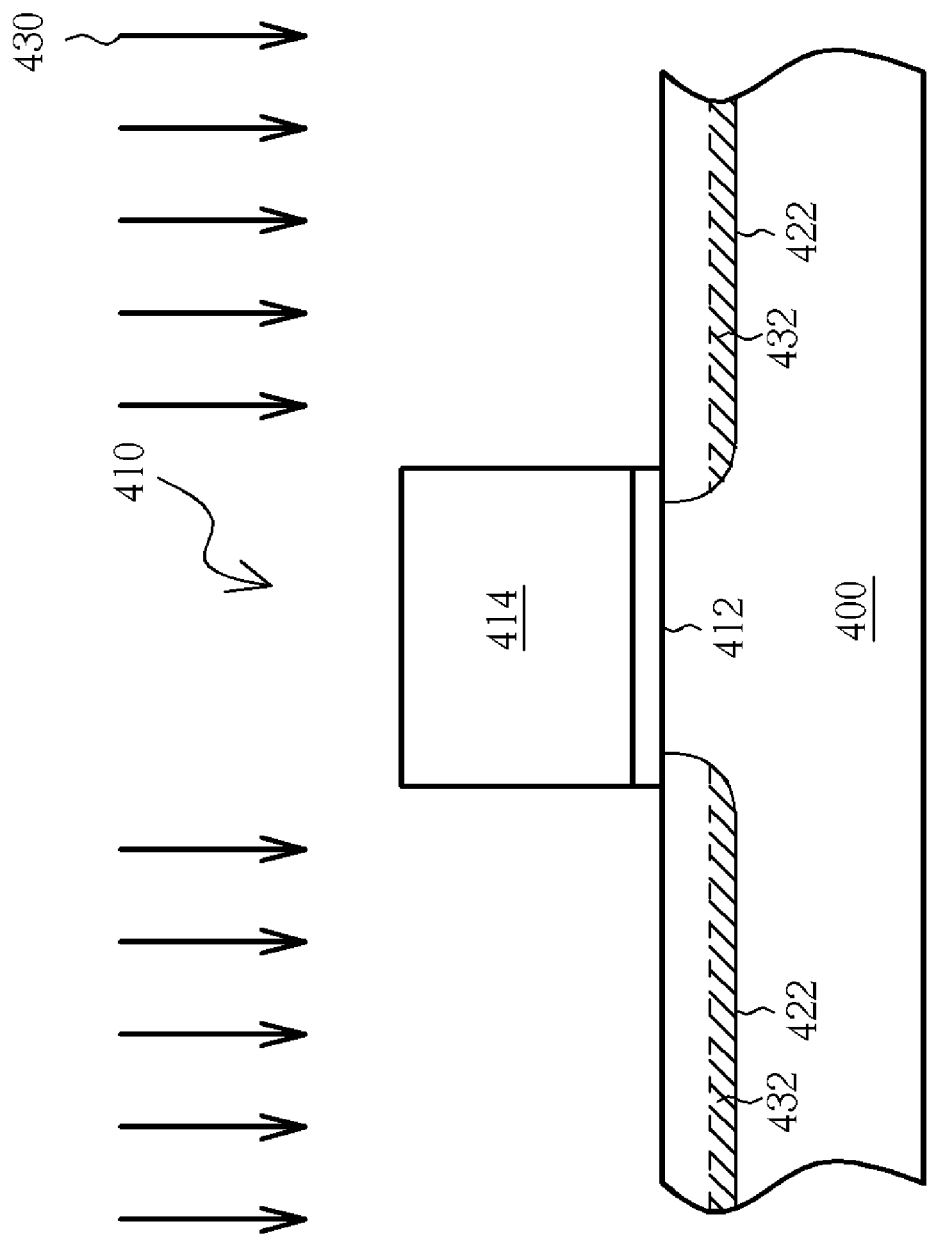
Figure 15:
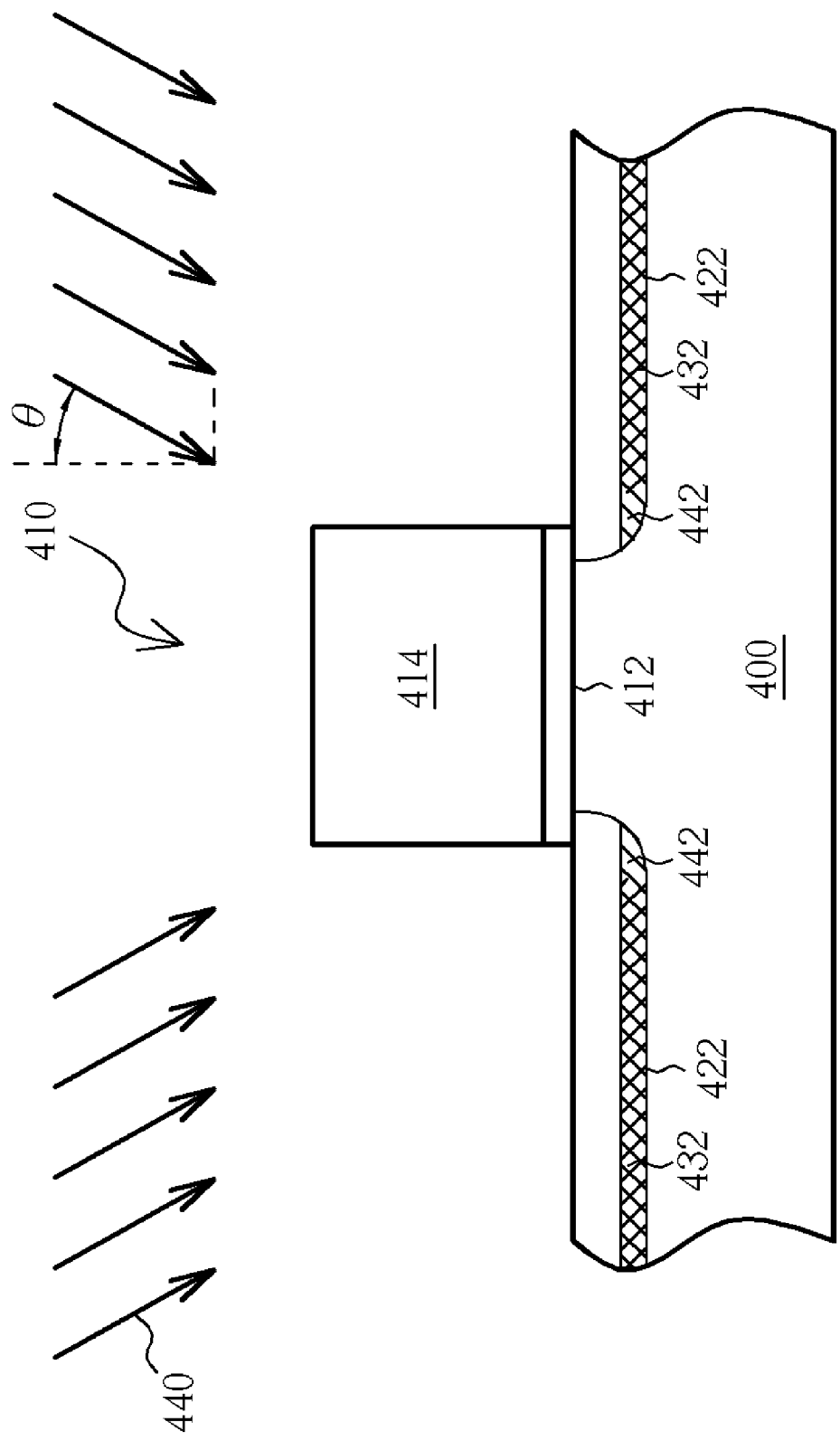

Please refer to FIGS. 14 and 15. Then, a first ion implantation process 430 is performed to implant a first dopant 432 into the amorphized regions 422. When the MOS transistor is a P-type MOS, the first dopant 422 comprises boron (B) or gallium (Ga). When the MOS transistor is an N-type MOS, the first dopant 422 comprises phosphorous (P) or arsenic (As).

As shown in FIG. 15, a co-implantation process 440 is performed to implant a co-implant dopant 442 into the substrate 400 adjacent to the gate structure 410. It is noteworthy that the co-implantation process 440 is an oblique angle implantation angled process and that an angle θ used in the co-implantation process is in a range from 0-45 degrees. The co-implant dopant 442 comprises carbon, fluorine, or nitrogen. An implantation energy depends on an implant position in the substrate 200, such as 3 KeV to 20 KeV; a dose may be $1 \times 10^{15}$ to $5 \times 10^{15}$ atoms/cm$^3$.

Please refer to FIG. 16. A first RTA process 450 is performed to activate the first dopant 432 and the co-implant dopant 442 at a temperature of 1000-1100° in a furnace or by an RTP. Meanwhile, a silicon lattice in the amorphized regions 422 is regrown and thus lightly doped drains (LDDs) 460 are formed in the substrate 400 adjacent to the gate structure 410.

Following the formation of the LDDs 460, spacers are formed on sidewalls of the gate structure 410. Then, a second ion implantation process and a second RTA process are performed to form a source/drain. The spacers can be removed after forming the source/drain depending on process or product requirements. The processes mentioned in the third preferred embodiment are similar to the processes described in the first preferred embodiment, therefore further description of these processes is omitted in the third preferred embodiment. As mentioned above, a pocket implantation process can be added before or after the co-implantation process 440 to form pocket-doped regions at an interface between the amorphized regions 422 and the substrate 400 to reduce a punch through effect.

Furthermore, the method for forming a MOS transistor provided by the present invention can be integrated with a selective strain scheme (SSS) to form an N-type MOS transistor having a high tensile stress film or a P-type MOS transistor having a high compressive stress film to further improve electron and hole mobility. The method provided by the present invention can also be integrated with a recessed SiGe source/drain or a recessed SiC source/drain to improve problems such as parasitic resistance and to increase driving current and speed.

Because the method for forming a MOS transistor provided be the present invention performs a co-implantation process before performing a PAI process, before the first ion implantation process, or after the first ion implantation process, the co-implant dopant can combine with the interstitial defects in the RTA process to prevent the MOS transistor from exhibiting the TED effect and lateral diffusion of the first dopant. In other words, the method provided by the present invention can effectively control the diffusion of the first dopant by the co-implantation process, thus a good junction profile is obtained and the short channel effect is suppressed.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for forming MOS transistor comprising steps of:
   providing a substrate having at least a gate structure thereon;
   performing a pre-amorphization (PAI) process to form amorphized regions in the substrate adjacent to two sides of the gate structure;
   performing a pocket implantation process to form pocket-doped regions between the amorphized regions;
   performing a co-implantation process to implant a co-implant dopant into the amorphized regions;
   performing a first ion implantation process to implant a first dopant into the amorphized regions;
   performing a first rapid thermal annealing (RTA) process to activate the first dopant and the co-implant dopant, regrow the amorphized regions to a substantially crystalline form, and form lightly doped drains (LDDs) in the amorphized regions;
   forming spacers on sidewalls of the gate structure; and
   forming a source/drain in the substrate adjacent to the spacers.

2. The method of claim 1, wherein the co-implantation process is an oblique angle implantation process and an angle used in the co-implantation process is in a range from 0-45 degrees.

3. The method of claim 1, wherein the co-implant dopant comprises carbon, fluorine, or nitrogen.

4. The method of claim 1 further comprising a step of performing a second RTA process directly after the co-implantation process and before the first RTA process.

5. The method of claim 4, wherein the second RTA process is performed at a temperature between 1000-1100° C.

6. The method of claim 1, wherein the pocket implantation process is performed before the co-implantation process.

7. The method of claim 1, wherein the pocket implantation process is performed after the co-implantation process.

8. The method of claim 1, wherein the co-implant dopant is implanted into the substrate at a position substantially the same as that of the first dopant.

9. The method of claim 1, wherein the first RTA process is performed at a temperature between 1000-1100° C.

10. The method of claim 1 further comprising a step of removing the spacers after forming the source/drain.

11. The method of claim 1, wherein the MOS transistor is a P-type MOS transistor.

12. The method of claim 11, wherein the first dopant comprises boron.

13. The method of claim 1, wherein the MOS transistor is an N-type MOS transistor.

14. The method of claim 13, wherein the first dopant comprises phosphorous or arsenic.

15. The method of claim 1, wherein the step of forming the source/drain further comprises:
performing a second ion implantation process to form a source/drain region in the substrate adjacent to the spacers; and
performing a third RTA process to form the source/drain in the source/drain regions.

16. A method for forming MOS transistor comprising steps of:
providing a substrate having at least a gate structure thereon;
performing a co-implantation process to implant a co-implant dopant into the substrate adjacent to two sides of the gate structure;
performing a pre-amorphization (PAI) process to form amorphized regions in the substrate adjacent to the two sides of the gate structure after the co-implantation process;
performing a first ion implantation process to implant a first dopant into the amorphized regions;
performing a first rapid thermal annealing (RTA) process to activate the co-implant dopant and the first dopant, regrow the amorphized regions to a substantially crystalline form, and form lightly doped drains (LDD) in the amorphized regions; and
forming source/drains in the substrate.

17. The method of claim 16, wherein the co-implantation process is an oblique angle implantation process and an angle used in the co-implantation process is in a range from 0-45 degrees.

18. The method of claim 16, wherein the co-implant dopant comprises carbon, fluorine, or nitrogen.

19. The method of claim 16 further comprising a step of performing a second RTA process directly after the co-implantation process before the first RTA process.

20. The method of claim 19, wherein the second RTA process is performed at a temperature between 1000-1100° C.

21. The method of claim 16, wherein the co-implant dopant is implanted into the substrate at a position substantially the same as that of the first dopant.

22. The method of claim 16 further comprising a step of performing a pocket implantation process before the co-implantation process to form pocket-doped regions between the amorphized regions.

23. The method of claim 16 further comprising a step of performing a pocket implantation process after the co-implantation process to form pocket-doped regions between the amorphized regions.

24. The method of claim 16, wherein the first RTA process is performed at a temperature between 1000-1100° C.

25. The method of claim 16 further comprising a step of forming spacers on sidewalls of the gate structure.

26. The method of claim 25 further comprising a step of removing the spacers after forming the source/drains.

27. The method of claim 16, wherein the MOS transistor is a P-type MOS transistor.

28. The method of claim 27, wherein the first dopant comprises boron.

29. The method of claim 16, wherein the MOS transistor is a N-type MOS transistor.

30. The method of claim 29, wherein the first dopant comprises phosphorous or arsenic.

31. The method of claim 16, wherein the step of forming the source/drain further comprises:
performing a second ion implantation process to form source/drain regions in the substrate adjacent to the spacers; and
performing a third RTA process to form the source/drain in the source/drain regions.

32. A method for forming MOS transistor comprising steps of:
providing a substrate having at least a gate structure thereon;
performing a pre-amorphization (PAI) process to form amorphized regions in the substrate adjacent to the gate structure;
performing a first ion implantation process to implant a first dopant into the amorphized regions;
performing a co-implantation process to implant a co-implant dopant into the amorphized regions after the first ion implantation process;
performing a first rapid thermal annealing (RTA) process to activate the first dopant and the co-implant dopant, regrow the amorphized regions to a substantially crystalline form, and form lightly doped drains (LDDs) in the amorphized regions; and
forming source/drains in the substrate.

33. The method of claim 32, wherein the co-implantation process is an oblique angle implantation process and an angle used in the co-implantation process is in a range from 0-45 degrees.

34. The method of claim 32, wherein the co-implant dopant comprises carbon, fluorine, or nitrogen.

35. The method of claim 32, wherein the co-implant dopant is implanted in the substrate at a position substantially the same as that of the first dopant.

36. The method of claim 32, wherein the first RTA process is performed at a temperature between 1000-1100° C.

37. The method of claim 32 further comprising a step of performing a pocket implantation process before the co-implantation process to form pocket-doped regions between the amorphized regions.

38. The method of claim 32 further comprising a step of performing a pocket implantation process after the co-implantation process to form pocket-doped regions between the amorphized regions.

39. The method of claim 32 further comprising a step of forming spacers adjacent to the gate structure.

40. The method of claim 39 further comprising a step of removing the spacers after forming the source/drains.

41. The method of claim 32, wherein the MOS transistor is a P-type MOS transistor.

42. The method of claim 41, wherein the first dopant comprises boron.

43. The method of claim 32, wherein the MOS transistor is a N-type MOS transistor.

44. The method of claim 43, wherein the first dopant comprises phosphorous or arsenic.

45. The method of claim 32, wherein the step of forming the source/drain further comprises:

performing a second ion implantation process to form a source/drain region in the substrate adjacent to the spacers; and performing a second RTA process to form the source/drain in the source/drain regions.

* * * * *